(12) United States Patent
Hönigschmid

(10) Patent No.: US 6,295,219 B1
(45) Date of Patent: Sep. 25, 2001

(54) INTEGRATED MEMORY

(75) Inventor: Heinz Hönigschmid, Starnberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/699,982

(22) Filed: Oct. 30, 2000

(30) Foreign Application Priority Data

Oct. 29, 1999 (DE) .............................................. 199 52 258

(51) Int. Cl.7 ...................................................... G11C 5/02
(52) U.S. Cl. ................................................ 365/51; 365/63
(58) Field of Search ........................................ 365/51, 63

(56) References Cited

U.S. PATENT DOCUMENTS 6,157,561 * 12/2000 Schlager et al. ....................... 365/51

FOREIGN PATENT DOCUMENTS

| 196 14 561 C2 | 3/1999 | (DE) . |
| 0 019 241 A1 | 11/1980 | (EP) . |
| 0 428 785 A1 | 5/1991 | (EP) . |

* cited by examiner

*Primary Examiner*—Trong Phan
(74) *Attorney, Agent, or Firm*—Herbert L. Lerner; Laurence A. Greenberg; Werner H. Stemer

(57) ABSTRACT

An integrated memory is described that differs from conventional memories in that it has second amplifier unit, which are present in addition to first amplifier units that are disposed outside a cell array, for the output signals of a row decoder. The second amplifier units serve for amplifying the decoder signals driven onto the word lines by the first amplifier units and, in contrast to the latter, are disposed within the cell array. Interference caused by crosstalk, for example, on the word lines is suppressed as a result of the second amplifier units that are additionally present.

4 Claims, 2 Drawing Sheets

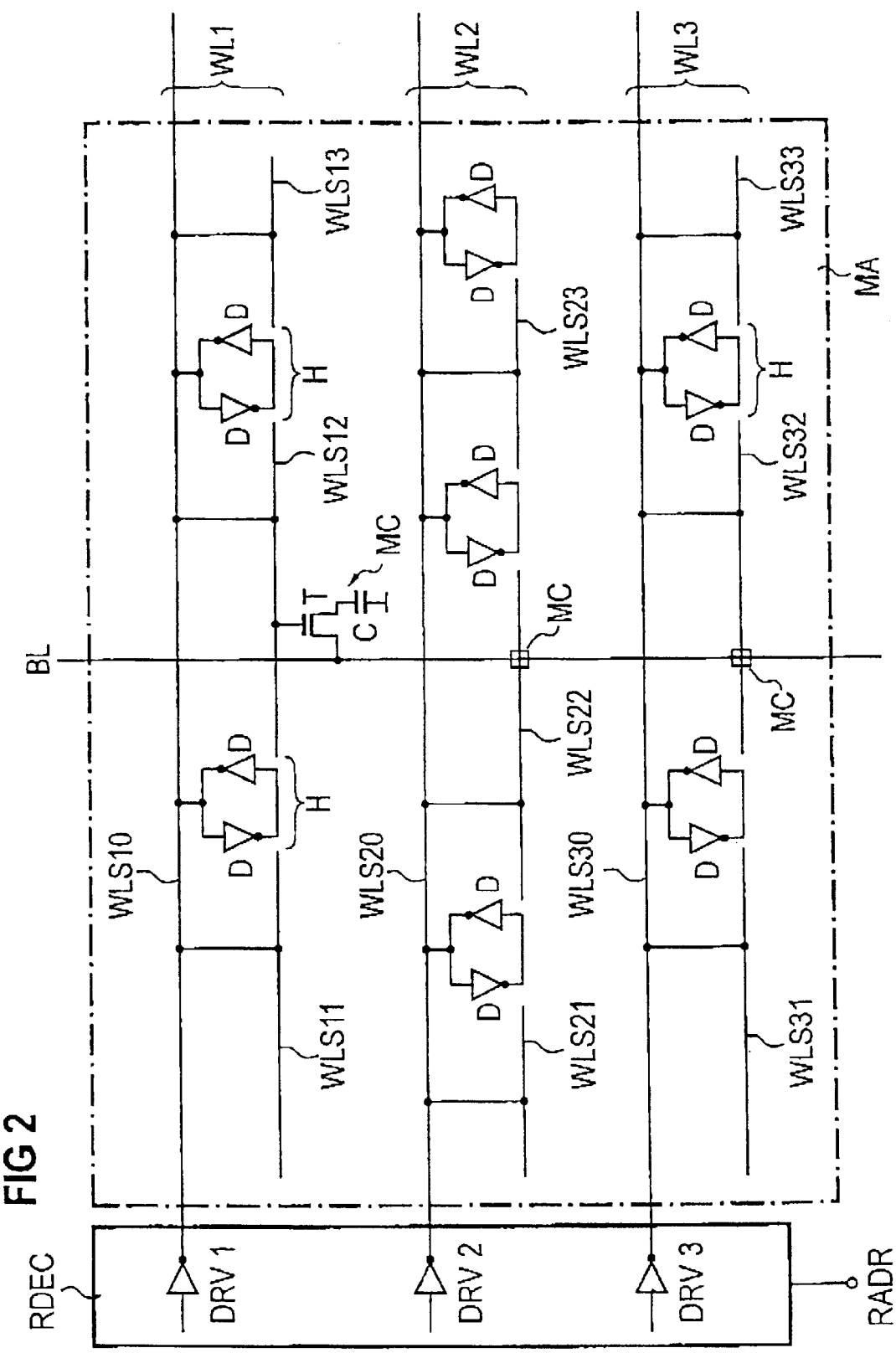

INTEGRATED MEMORY

BACKGROUND OF THE INVENTION

Field of the Invention

The invention relates to an integrated memory having a cell array with a plurality of memory cells located at intersecting points of associated word and bit lines. A row decoder is provided for addressing the word lines in response to received row address signals. The row decoder has amplifiers for outputting decoder signals onto the word lines.

Such an integrated memory is described in Published, European Patent Application EP 0 428 785 A1, for example, where driver stages for driving the word lines are situated between cell array blocks. The driver stages drive output signals from word decoders.

In the so-called "folded bit line structure" of the prior art, two bit lines of a bit line pair run parallel to one another in a wiring plane of the memory. During memory accesses, the two associated bit lines carry opposite potentials in each case, namely logic 1 and logic 0. The interfering influences caused by the bit lines on the word lines which cross them are at least partly canceled out on account of their opposite potentials. A so-called "vertical folded bit line structure" is conceived of, inter alia, for future memories. In this structure, the two bit lines of a bit line pair do not run in a common wiring plane of the memory but rather above one another in different wiring planes. Therefore, compensation of the interfering influences—caused because of capacitive coupling—on the word lines which cross the bit lines no longer occurs in such memories. In memories of this type, therefore, the signals present on the word lines could be subjected to interference in an impermissible manner.

SUMMARY OF THE INVENTION

It is accordingly an object of the invention to provide an integrated memory that overcomes the above-mentioned disadvantages of the prior art devices of this general type, in which any impairment caused by the interfering influences is avoided.

With the foregoing and other objects in view there is provided, in accordance with the invention, an integrated memory having word lines formed of first and second conductive structures disposed in each case in different wiring planes. Each of the first conductive structures is embodied substantially in one piece. Each of the second conductive structures have a plurality of segments embodied such that they are separated from one another by interruptions and each of the segments is connected to an associated one of the first conductive structures. Bit lines are provided that cross over the word lines at crossover points. A cell array having a plurality of memory cells disposed at the crossover points of the word lines and the bit lines is provided. Each of the memory cells have a selection element for selection of a respective memory cell of the memory cells, the selection element having a control terminal connected to one of the word lines. A row decoder is provided and has outputs connected to one end of the word lines at an edge of the cell array and inputs receiving row addresses. The row decoder, in a manner dependent on the row addresses generates decoders signals driving the word lines. The row decoder has an output side and first amplifier units disposed on the output side for driving the decoder signals onto the word lines. Second amplifier units are disposed within the cell array. At least one of the second amplifier units is provided for each of the word lines for amplifying the decoder signals driven onto the word lines by the first amplifier units. The second amplifier units are disposed in the interruptions between the segments of associated ones of the second conductive structures and are connected to the first conductive structures for amplifying the decoder signals propagating on the first conductive structures.

According to the invention, at least one additional second amplifier unit is provided per word line for amplifying the decoder signals driven onto the word lines by the first amplifier units, which unit is disposed within the cell array and is connected to the associated word line.

The second amplifier units thus locally amplify in the cell array the decoder signals that are fed to them. The additional amplification of the decoder signals prevents the latter from being influenced by interfering influences which may be caused for example by crosstalk on account of signal changes occurring on the bit lines.

It is particularly advantageous if the second amplifier units are holding circuits that amplify the decoder signals fed to them but are not disposed in the signal path which is to be traveled by the decoder signals and is formed by the respective word line. This prevents the occurrence of a propagation delay of the decoder signals on the word lines on account of the presence of the second amplifier units.

By way of example, the second amplifier units may be disposed at that end of the associated word line that is remote from the associated first amplifier unit. This has the advantage that the decoder signals propagating on the word lines are amplified at the point where they are the weakest, since that is where the distance from the first amplifier units is the greatest.

In accordance with another feature of the invention, the first conductive structures are formed from metal and the second conductive structures are formed from polysilicon.

Other features which are considered as characteristic for the invention are set forth in the appended claims.

Although the invention is illustrated and described herein as embodied in an integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a circuit diagram of a second exemplary embodiment of the integrated memory.

DESCRIPTION OF THE PREFERRED EMBODIMENTS

Figure 1:
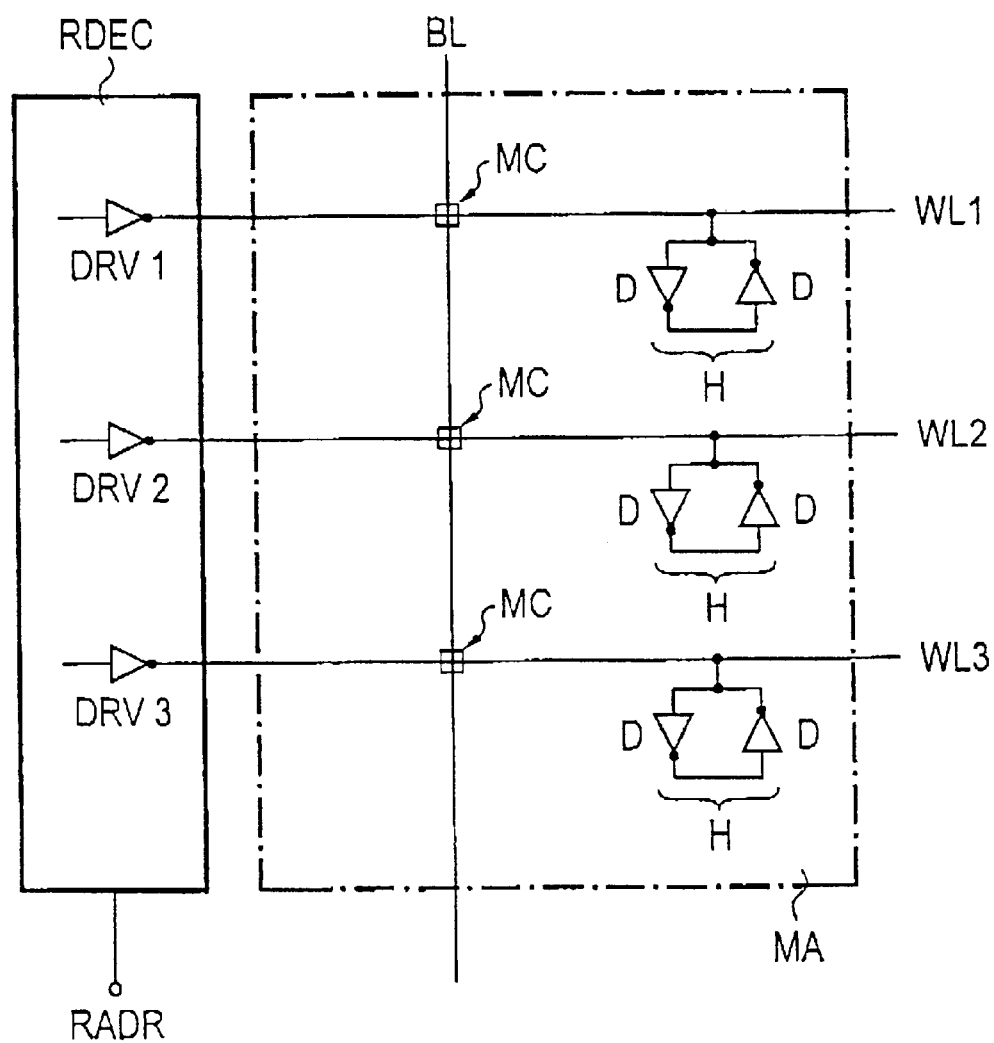
FIG. 1 is a circuit diagram of a first exemplary embodiment of an integrated memory according to the invention.

In all the figures of the drawing, sub-features and integral parts that correspond to one another bear the same reference symbol in each case. Referring now to the figures of the drawing in detail and first, particularly, to FIG. 1 thereof, there is shown an integrated memory whose memory cells MC are disposed at crossover points of bit lines BL and word lines WLi. For the sake of clarity, only one of the bit lines BL and three of the word lines WLi have been illustrated in FIG. 1. The bit lines BL are selected by a non-illustrated column decoder in a manner dependent on column addresses that are fed to the memory. One of the word lines WLi is selected by a row decoder RDEC in a manner dependent on row addresses RADR which are fed thereto. Corresponding decoder signals generated by the row decoder RDEC are fed to the word lines WLi via first amplifier units DRVi. The first amplifier units DRVi are situated outside the cell array MA, as is customary in memories of this type. They are connected to one end of the word lines WLi assigned to them, at the edge of the cell array MA.

According to the invention, there are situated within the cell array MA second amplifier units H in the form of holding circuits, which serve for amplifying the decoder signals present on the word lines WLi. Each holding circuit has two inverters D disposed back-to-back. The holding circuits H are disposed at that end of the word lines WLi that is remote from the first amplifier units DRVi. As a result of this, the decoder signals present on the word lines WLi are amplified at the point where they are the weakest.

FIG. 2 shows a second exemplary embodiment of the integrated memory, which differs from that in FIG. 1 with regard to the configuration of the word lines WLi. Each word line WLi has first conductive structures WLSi0 and second conductive structures WLSi1, WLSi2, WLSi3 disposed in different wiring planes of the memory in each case. The two different wiring planes are formed by conductive layers of the memory which are disposed above or below one another. In this case, the first conductive structure WLSi0 are realized by a metal, for example aluminum. The second conductive structures WLSi1, WLSi2, WLSi3 are realized by polysilicon. While the first conductive structures WLSi0 are embodied in one piece, the second conductive structures WLSi1, WLSi2, WLSi3 are subdivided into a plurality of segments which are separated from one another by interruptions. Each of these segments is connected to the associated first conductive structure WLSi0 via a corresponding plated-through hole.

The second conductive structures WLSi1, WLSi2, WLSi3 form the gates of selection transistors T of the memory cells MC. One of the memory cells MC is illustrated explicitly in FIG. 2. The bit line BL is connected to one electrode of a storage capacitor C of the memory cell MC via the controllable path of the selection transistor T. The other electrode of the storage capacitor C is connected to ground.

Each of the segments of the second conductive structures WLSi1, WLSi2, WLSi3 in FIG. 2 intersects with a multiplicity of bit lines BL, so that each of the segments is connected to a multiplicity of memory cells MC. Once again, for the sake of clarity, only one of the bit lines BL has been illustrated in FIG. 2.

The memory shown in FIG. 2 has a multiplicity of second amplifier units H per word line WLi. The amplifier units H are disposed wherever there are interruptions between the segments of the second conductive structures WLSi1, WLSi2, WLSi3. Space is available in these regions in any case because of the presence of the interruptions. This space is utilized for realizing the second amplifier unit H. The provision of a large number of second amplifier units H per word line WLi results in that each of the second amplifier units H can be given relatively small dimensions. A sufficient gain in the decoder signals propagating on the word lines WLi is nevertheless achieved, and interference is thus suppressed to a sufficient extent as well.

Although it would also be possible for the second amplifier units H in FIG. 2 not to be realized by the holding circuits illustrated but by amplifying units situated directly in the propagation path of the decoder signals, that would result in a reduction in the propagation speed of the decoder signals on the word lines WLi or the first conductive structures WLSi0 thereof, which is often undesirable.

I claim:

1. An integrated memory, comprising:

word lines formed of first and second conductive structures disposed in each case in different wiring planes, each of said first conductive structures embodied substantially in one piece, each of said second conductive structures have a plurality of segments embodied such that they are separated from one another by interruptions and each of said segments connected to an associated one of said first conductive structures;

bit lines crossing over said word lines at crossover points;

a cell array having a plurality of memory cells disposed at said crossover points of said word lines and said bit lines, each of said memory cells having a selection element for selection of a respective memory cell of said memory cells, said selection element having a control terminal connected to one of said word lines;

a row decoder having outputs connected to one end of said word lines at an edge of said cell array and inputs receiving row addresses, said row decoder, in a manner dependent on the row addresses generates decoders signals driving said word lines, said row decoder having an output side and first amplifier units disposed on said output side for driving the decoder signals onto said word lines; and second amplifier units disposed within said cell array, at least one of said second amplifier units provided for each of said word lines for amplifying the decoder signals driven onto said word lines by said first amplifier units, said second amplifier units disposed in said interruptions between said segments of associated ones of said second conductive structures and connected to said first conductive structures for amplifying the decoder signals propagating on said first conductive structures.

2. The integrated memory according to claim 1, wherein said first conductive structures are formed from metal and said second conductive structures are formed from polysilicon.

3. The integrated memory according to claim 1, wherein said second amplifier units are disposed at ends of associated ones of said word line which are remote from said associated ones of said first amplifier units.

4. The integrated memory according to claim 1, wherein said second amplifier units are holding circuits.

* * * * *